(12) United States Patent
Tanaka et al.

(10) Patent No.: US 8,449,160 B2
(45) Date of Patent: May 28, 2013

(54) MULTI-WAVELENGTH LIGHT EMITTING DEVICE

(75) Inventors: Kenichi Tanaka, Tokyo (JP); Masahiro Aoki, Kokubunji (JP); Tsukuru Ohtoshi, Hanno (JP)

(73) Assignee: Hitachi, Ltd., Tokyo (JP)

( * ) Notice: Subject to any disclaimer, the term of this patent is extended or adjusted under 35 U.S.C. 154(b) by 256 days.

(21) Appl. No.: 12/849,352

(22) Filed: Aug. 3, 2010

(65) Prior Publication Data
US 2011/0063871 A1    Mar. 17, 2011

(30) Foreign Application Priority Data
Sep. 15, 2009   (JP) ................................. 2009-212648

(51) Int. Cl.
*F21V 7/04*      (2006.01)
(52) U.S. Cl.
USPC ............................. 362/553; 362/554; 362/555

(58) Field of Classification Search
USPC .......................................... 362/553, 554, 555
See application file for complete search history.

(56) References Cited

U.S. PATENT DOCUMENTS

| | | | |
|---|---|---|---|
| 6,142,650 A * | 11/2000 | Brown et al. ................. | 362/259 |
| 6,916,097 B2 * | 7/2005 | Omoda et al. ................. | 353/31 |
| 2007/0133628 A1 * | 6/2007 | Komatsu et al. ............... | 372/21 |
| 2009/0154137 A1 * | 6/2009 | Bierhuizen et al. ............ | 362/84 |
| 2009/0190371 A1 * | 7/2009 | Root et al. .................... | 362/554 |

FOREIGN PATENT DOCUMENTS

JP     2008-309935 A     12/2008

* cited by examiner

*Primary Examiner* — Evan Dzierzynski
(74) *Attorney, Agent, or Firm* — Crowell & Moring LLP (57) ABSTRACT

A multi-wavelength light emitting device includes the following three sections; a light source section having multiple luminous points that emit multiple light beams, a condenser lens section that concentrates the light beams emitted from the luminous points, and a light guide section that propagates superposedly and mixedly the light beams concentrated by the condenser lens section after emission thereof from the luminous points.

9 Claims, 11 Drawing Sheets

SPATIALLY PROPAGATING LIGHT

FIG. 2B

ON-SCREEN BEAM POSITIONING IN PROJECTION OF THREE RGB LIGHT SOURCE BEAMS PROPAGATING SPATIALLY FROM CONVENTIONAL APPARATUS

FIG. 2C

LIGHT PROPAGATING THROUGH LIGHT GUIDE SECTION

FIG. 2D

ON-SCREEN BEAM POSITIONING OF THREE RGB LIGHT SOURCE BEAMS PROPAGATING THROUGH LIGHT GUIDE SECTION

MULTI-WAVELENGTH LIGHT EMITTING DEVICE

CLAIM OF PRIORITY

The present application claims priority from Japanese patent application JP 2009-212648 filed on Sep. 15, 2009, the content of which is hereby incorporated by reference into this application.

FIELD OF THE INVENTION

The present invention relates to a multi-wavelength light emitting device and more particularly to a multi-wavelength light emitting device applicable to an image projector.

BACKGROUND OF THE INVENTION

A projection-type image display apparatus (projector) for displaying images on a large screen is used highly frequently at presentations in such places as conference halls and assembly rooms. In a conventional projector, a large-sized light source typified by a halogen lamp or a metal halide lamp is adopted for the purpose of use at presentations to a relatively large audience.

In recent years, however, there has been an increasing demand for a type of projector that is connected to or incorporated in a mobile phone terminal or a notebook PC for the purpose of use at presentations to a few or several viewers. In this trend, particular attention is being given to a projector equipped with light emitting elements (light emitting diodes (LED) or semiconductor lasers) as light sources to display an image by raster-scanning light beams from the light emitting elements. Such a projector is called a "micro-projector" because of the size thereof. In operation of the micro-projector, light beams having wavelengths that approximately correspond to three RGB primary colors (red, blue, green) from light emitting elements are raster-scanned across a screen or applied thereon to provide still image projection.

A projector of a common type is designed to operate in a fashion that light beams emitted from RGB light sources are scanned by using an optical part such as an MEMS (micro electro mechanical systems) mirror for direct projection onto a screen. In the case of a projector using laser light beams, since each of RGB light sources can be controlled independently, there is no need to use RGB subpixels for forming each pixel as required in a flat display panel such as is represented by a liquid crystal display panel. In optical axial alignment of the projector using laser light beams, RGB beam positions are superposed on a screen so as to form a white beam spot thereon.

Japanese patent document JP-A-2008-309935 discloses a technique for optical axial alignment by using two dichroic mirrors in projection of spatially propagating light beams from R, G, and B light sources.

SUMMARY OF THE INVENTION

Figure 2A:
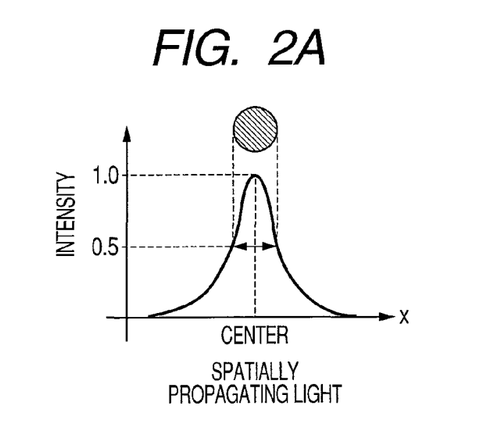
FIG. 2A shows a spectrum of light intensity with respect to a beam diameter in projection of spatially propagating light from a conventional multi-wavelength light emitting device.
Figure 2B:
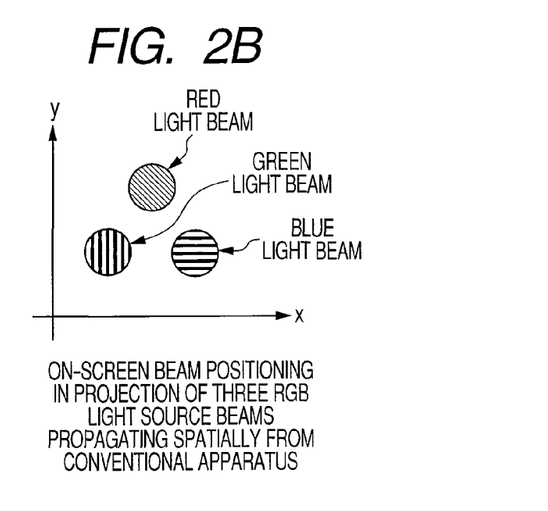
FIG. 2B shows on-screen beam positioning in projection of three RGB light source beams propagating spatially from the conventional multi-wavelength light emitting device.

With the technique for optical axial alignment by using two dichroic mirrors disclosed in the JP-A-2008-309935, however, an effective beam diameter is extremely small since a spectrum of light intensity with respect to a beam diameter is centerwardly overconcentrated (FIG. 2A shows a spectrum of light intensity with respect to a beam diameter in projection of spatially propagating light from a conventional multi-wavelength light emitting, device disclosed in the JP-A-2008-309935, and FIG. 2B shows on-screen beam positioning in projection of three RGB light source beams propagating spatially from the conventional multi-wavelength light emitting device disclosed therein). Hence, in the conventional multi-wavelength light emitting device, it is rather difficult to properly accomplish optical axis alignment, giving rise to a problematic tendency to positional deviation of three RGB light source beams on a screen. In the use of a light emitting element or a semiconductor laser in particular, since a beam diameter and a beam axial position vary with time due to an increase in local temperature or other variations in operating environmental conditions, three RGB light source beams are liable to deviate on a screen. Therefore, with the technique disclosed in the JP-A-2008-309935, the degree of relative deviation with respect to a beam spot diameter is likely to increase to cause misreproduction of colors and attenuation of light intensity. That is, an optimal module structure as a projector light source is not attainable through use of the technique disclosed in the JP-A-2008-309935. Further, this technique requires an increase in component part count due to the provision of such parts as dichroic mirrors, thus disadvantageously causing higher levels of total part cost and assembly cost.

It is therefore an object of the present invention to provide a multi-wavelength light emitting device wherein misreproduction of colors and attenuation of light intensity due to axial misalignment can be reduced in projection of light beams having different wavelengths that are superposed at a target position on a screen.

The multi-wavelength light emitting device of the present invention includes multiple sections for solving the above-mentioned problem with the conventional technique. The representative features of these sections disclosed by the present invention are briefed below:

In carrying out the present invention and according to a specific aspect thereof, there is provided a multi-wavelength light emitting device for addressing the above-mentioned problem, the multi-wavelength light emitting device comprising: a light source section; a condenser lens section; and a light guide section; wherein the light source section is arranged to include multiple luminous points that emit multiple light beams, the condenser lens section is arranged to concentrate the light beams emitted from the luminous points, and the light guide section is arranged to propagate superposedly and mixedly the light beams concentrated by the condenser lens section after emission thereof from the luminous points. The provision of the light guide section thus arranged facilitates optical axial alignment of the light beams, making it possible to reduce misreproduction of colors and attenuation of light intensity due to axial misalignment.

Further, according to a preferable aspect of the present invention, at least either one of input and output end faces of the light guide section of the multi-wavelength light emitting device is provided with an optical element. In an arrangement wherein a refracting optical element is disposed at the input end face (light source side) of the light guide section, multiple reflections of the light beams can be repeated efficiently during propagation thereof through a light guiding medium in the light guide section so as to adequately mix the light beams. Contrastingly, in an arrangement wherein a refracting optical element is disposed at the output end face (outlet side) of the light guide section, the light beams issued from the light guide section can be collimated so as to display high-definition color images on a screen located at a distance of approximately one meter in the case of RGB light source, for example. The term "optical element" as used herein indicates a component element that exerts any optical effect (e.g., reflection, transmission, refraction, or diffraction) on a light beam applied thereto; more specifically, an optical element is a lens or a diffraction grating, for example.

Still further, according to another preferable aspect of the present invention, the light source section, the condenser lens section, and the light guide section of the multi-wavelength light emitting device are contained in one modular package, which is mounted on a can-stem. This arrangement makes it possible to form a small type of multi-wavelength light emitting device featuring general versatility.

Furthermore, according to another preferable aspect of the present invention, the light guide section of the multi-wavelength light emitting device has an internal structural component that is selected from an optical fiber cable, a bundle optical fiber cable, liquid crystalline fiber cable, a light guide plate, a light tunnel, and a light pipe.

Moreover, according to another preferable aspect of the present invention, the light source section of the multi-wavelength light emitting device includes multiple light source components each of which is selected from a semiconductor laser and a semiconductor light emitting element. This arrangement makes it possible to implement small-sized optics capable of displaying color images on a screen in the case of RGB light source, for example.

Still further, according to another preferable aspect of the present invention, the light source section of the multi-wavelength light emitting device includes multiple light source components each of which is selected from a wavelength conversion laser (second-harmonic-generation (SHG) laser) formed with a fundamental-wave semiconductor laser and a nonlinear crystal part serving as a wavelength conversion element, a semiconductor laser, and a semiconductor light emitting element (light emitting diode (LED)). This arrangement is advantageous in that each color light source having a single wavelength provides a high level of color purity and a high degree of coherence to allow easy beam shaping (convergence), thus making it possible to display high-definition color images on a screen.

Still further, according to another preferable aspect of the present invention, each of the light source components is mounted by using a multilayer laminate substrate. More specifically, it is preferable to provide a recess in a top layer of the multilayer laminate substrate and to mount optical elements such as light emitting elements and mirror elements by using an inner wiring layer. Since signal wiring connections to the light source components are simplified, it is possible to reduce the size of each light source unit including lenses and other optical parts.

Still further, according to another preferable aspect of the present invention, the nonlinear crystal part included in the wavelength conversion laser is mounted by using a multilayer laminate substrate. This arrangement allows connections between wiring lines of the multilayer laminate substrate and temperature control terminals of the nonlinear crystal part, contributing to facilitation in assembly process.

In addition, according to another preferable aspect of the present invention, the multi-wavelength light emitting device is arranged in combination with MEMS mirror optical components to configure an image projector. The image projector thus configured is applicable as an optical engine for a raster-scan display device.

As set forth hereinabove and according to the present invention, in the multi-wavelength light emitting device that superposes light beams having different wavelengths at a target position on a screen, it is possible to reduce misreproduction of colors and attenuation of light intensity due to axial misalignment.

BRIEF DESCRIPTION OF THE DRAWINGS

FIGS. 2A to 2D are diagrams for explaining the principle of how to suppress optical axial misalignment by using multiwavelength light sources in the present invention, in which

DETAILED DESCRIPTION OF THE PREFERRED EMBODIMENTS

The present invention will now be described in detail by way of example with reference to the accompanying drawings as related to structural and functional features of a variety of preferred embodiments thereof. Throughout the accompanying drawings, like reference characters designate like or corresponding parts to avoid repetitive description thereof. It is to be understood that parts described hereinbelow are not necessarily depicted in accurate dimensional ratios in the accompanying drawings.

First Preferred Embodiment

Figure 1:
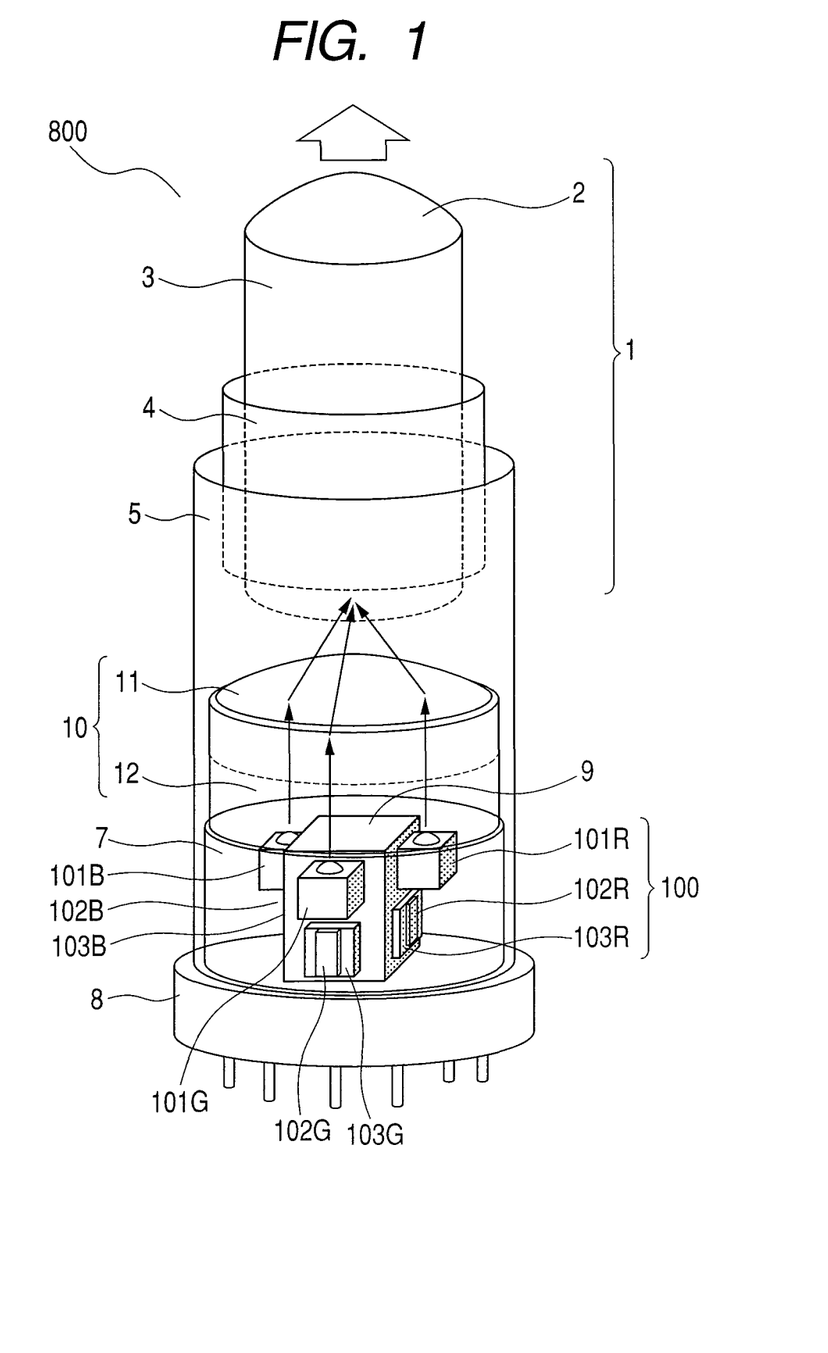
FIG. 1 is a structural diagram of a multi-wavelength light emitting device according to a first preferred embodiment of the present invention.
Figure 2C:
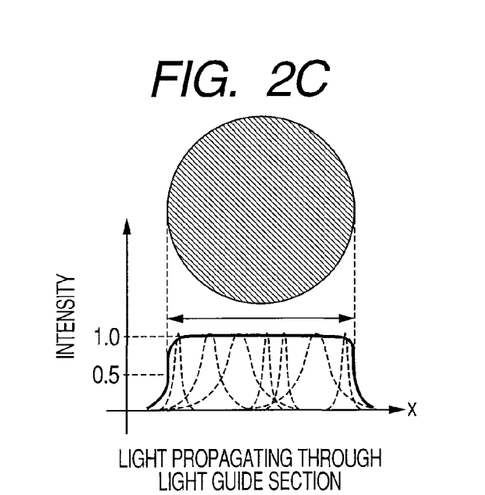
FIG. 2C shows a spectrum of light intensity with respect to a beam diameter in projection of light propagating through a light guide section of the present invention.
Figure 2D:
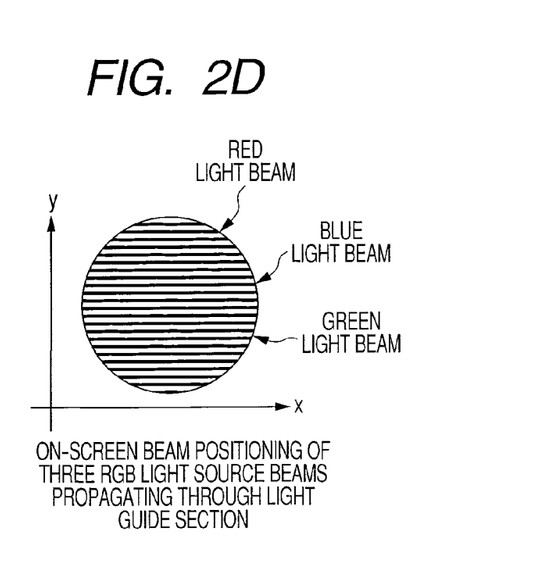
FIG. 2D shows on-screen beam positioning in projection of three RGB light source beams propagating through the light guide section of the present invention.

Referring to FIG. 1, the structure of a multi-wavelength light emitting device according to a first preferred embodiment of the present invention is described below. With reference to FIGS. 2C and 2D, there is also described below an arrangement for light beam propagation through a light guide section after emission from a multiwavelength light source.

FIG. 1 shows the structural arrangement of the multi-wavelength light emitting device according to the first preferred embodiment. In FIG. 2C, there is shown a spectrum of light intensity with respect to a beam diameter in projection of light propagating through the light guide section of the present invention, and in FIG. 2D, there is shown on-screen beam positioning in projection of three RGB light source beams propagating through the light guide section of the present invention.

In the first preferred embodiment, a multi-wavelength light emitting device 800 includes a light source section 100, a condenser lens section 10, and a light guide section 1.

The light source section 100 includes multiple luminous points, i.e., a red light source unit (lens 101R, light emitting element 102R, submount 103R), a blue light source unit (lens 101B, light emitting element 102B, submount 103B), and a green light source unit (lens 101G, light emitting element 102G, submount 103G). Each of these three light source units is mounted on one of three side faces of a square-pole-like protrusion stage 9 that is disposed to protrude perpendicularly from a stem retained by a stem holder 8. In the red light source unit, taken as a representative example of the three light source units, the submount 103R having the light emitting element 102R mounted thereon is secured to one side face of the protrusion stage 9 on the stem so that the light emitting element 102R emits light in the protruding direction of the protrusion stage 9 on the stem, i.e., in the upward direction in FIG. 1. At an upper position with respect to the submount 103R, the lens 101R is secured on an optical axis in an emitting direction of the light emitting element 102R. Thus, the light source section 100 is disposed in a space of a cylindrical cover holder 7 secured to the stem.

The condenser lens section 10 includes a condenser lens 11, and a lens holder 12; and the condenser lens section 10 is supported by the cover holder 7.

The light guide section 1 includes a collimating optical element (collimating lens) 2 serving for collimation at light emission, a light guiding medium 3, and a sleeve 4; and the light guide section 1 is supported by a cover holder 5.

As indicated by the arrowed lines in FIG. 1, the condenser lens 11 concentrates multiple light beams emitted from the multiple luminous points which forms the light source section 100 to introduce thereof into the light guide section 1.

Through the light guiding medium 3 included in the light guide section 1, each of the multiple light beams thus introduced thereinto propagates while repeating multiple reflections.

At output from the light guide section 1, a single light beam is formed as a result of mixing the multiple light beams through the light guiding medium 3 (refer to FIGS. 2C and 2D). Thus, the emission light beam from the light guiding medium 3 is collimated through the collimating lens 2 for light emission.

In the multi-wavelength light emitting device shown in FIG. 1, the multiple light beams emitted from the three RGB light sources are concentratedly introduced into the light guide section so as to align the axes of the light beams. As compared with the technique for axial adjustment by using two dichroic mirrors disclosed in the patent document JP-A-2008-309935, a relatively low degree of accuracy is therefore required for axial adjustment in the multi-wavelength light emitting device according to the first preferred embodiment. Thus, in the use of the multi-wavelength light emitting device that superposes light beams having different wavelengths at a target position of projection, it is possible to reduce misreproduction of colors and attenuation of light intensity attributable to axial misalignment. Further, substantial reductions in component part count and assembly cost can be achieved advantageously according to the first preferred embodiment.

Second Preferred Embodiment

Figure 3:
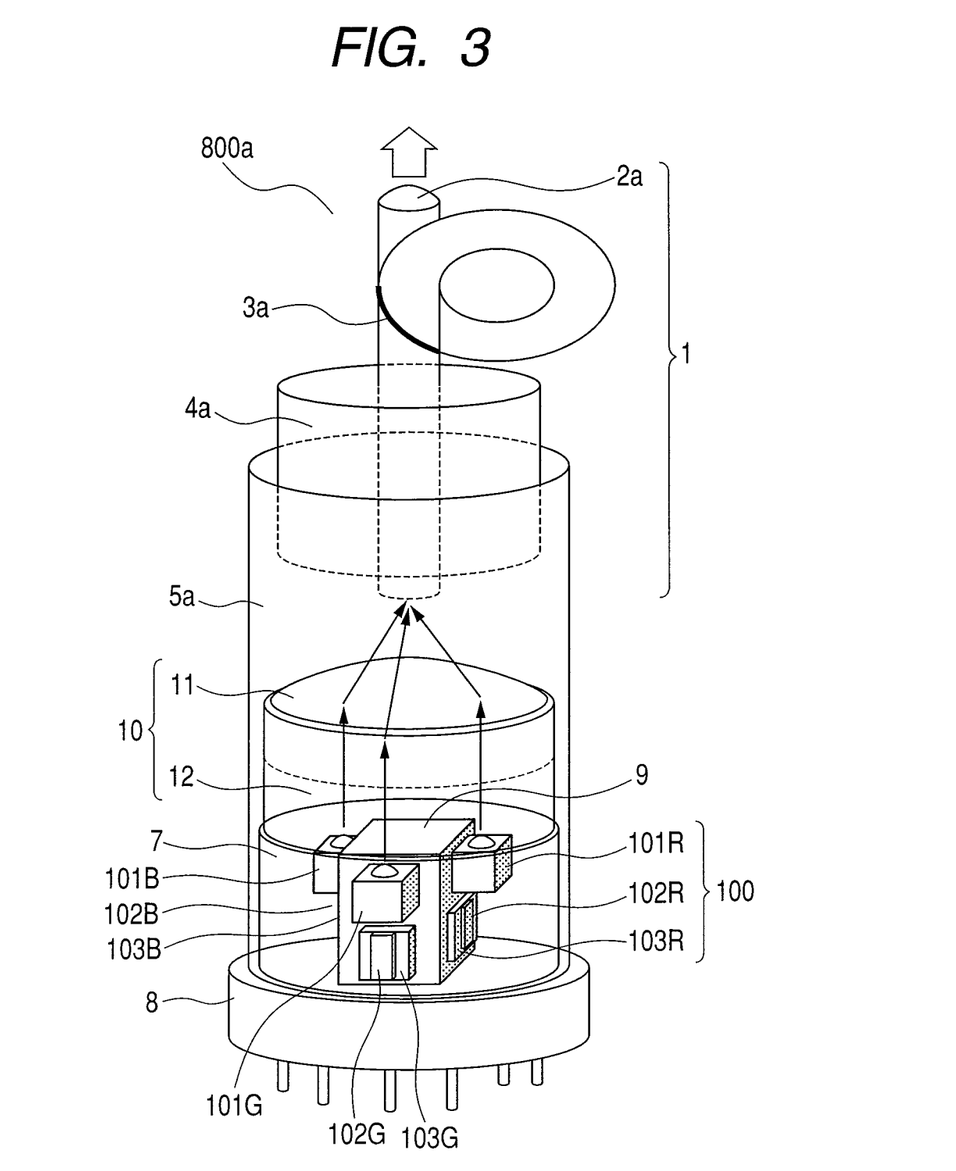
FIG. 3 is a diagram for explaining the outline of the multi-wavelength light emitting device according to a second preferred embodiment of the present invention.

Referring to FIG. 3, there is shown a diagram for explaining the outline of the multi-wavelength light emitting device according to a second preferred embodiment of the present invention.

In the second preferred embodiment, a multi-wavelength light emitting device 800a includes a light source section 100, a condenser lens section 10, and a light guide section 1. The light source section 100 and the condenser lens section 10 are arranged similarly to those of the first preferred embodiment.

Differently from the case of the first preferred embodiment wherein the light guiding medium 3 is formed in a short cylindrical shape, an optical fiber cable is used as a light guiding medium 3a in the second preferred embodiment as shown in FIG. 3. Since the optical fiber cable used as the light guiding medium 3a has a small diameter, there is disposed a sleeve 4a having a relatively large thickness in the radial direction thereof.

Regarding the light guiding medium 3a, the length of propagation can be increased by using an optical fiber cable having a longer length so that the multiple light beams are mixed adequately through the optical fiber cable. Thus, a single light beam having a uniform intensity distribution is emitted from the light guiding medium 3a. It is to be noted that, even in the use of an optical fiber cable having a considerable length, the optical fiber cable can be contained in a limited space by neatly arranging the optical fiber cable in a coiled form as shown in FIG. 3.

In the second preferred embodiment, a collimating lens 2a is disposed at the output end face of the light guiding medium 3a similarly to the case of the first preferred embodiment. Thus, a collimated light beam is issued from the light guide section 1. In addition to the advantageous effects of the first preferred embodiment, a uniform level of light intensity distribution is provided in the second preferred embodiment. Hence, according to the second preferred embodiment, it is possible to suppress color variations and luminance variations in a beam spot.

Third Preferred Embodiment

Figure 4:
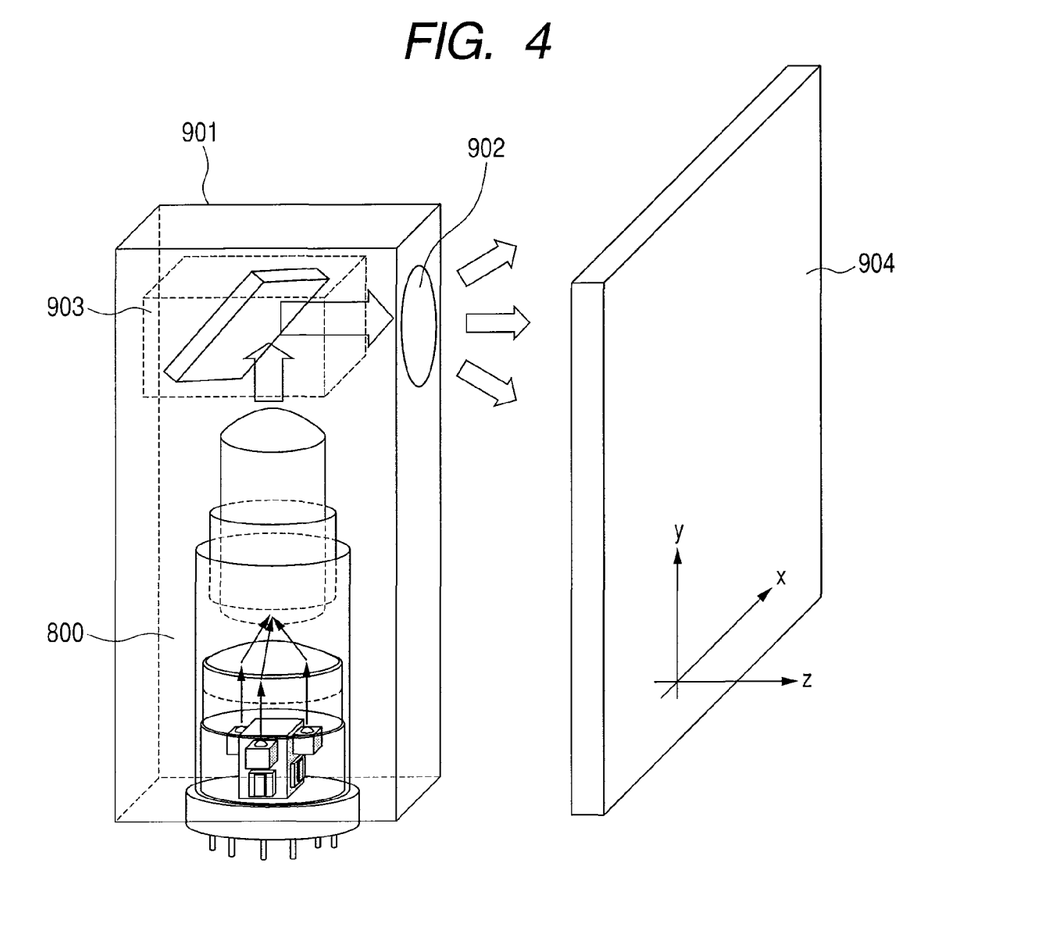
FIG. 4 is a diagram for explaining the outline of an image projector using the multi-wavelength light emitting device according to a third preferred embodiment of the present invention.

Referring to FIG. 4, there is shown a diagram for explaining the outline of an image projector using the multi-wavelength light emitting device according to a third preferred embodiment of the present invention.

In the third preferred embodiment, an image projector cabinet 901 contains the multi-wavelength light emitting device 800, a beam scanning section 903 having MEMS mirror optics, and a beam outlet 902.

The multi-wavelength light emitting device 800 is the same as that used in the first or second preferred embodiment. More specifically, the stem holder 8 of the multi-wavelength light emitting device 800 is secured to the image projector cabinet 901 in a fashion that lead pins are arranged to protrude from the stem. The beam scanning section 903 includes MEMS mirror optical components.

A light beam issued from the multi-wavelength light emitting device 800 is raster-scanned by the beam scanning section 903 for RGB image formation. Thus, through the beam outlet 902, RGB light is projected onto a screen 904 to provide color imaging thereon.

Since the multi-wavelength light emitting device 800 described in the first or second preferred embodiment is employed in the image projector according to the third preferred embodiment, it is possible to reduce misreproduction of colors and attenuation of light intensity attributable to axial misalignment in image projection where light beams having different wavelengths are superposed at a target position on the screen 904. Further, substantial reductions in component part count and assembly cost can be achieved advantageously according to the third preferred embodiment.

Fourth Preferred Embodiment

Figure 5:
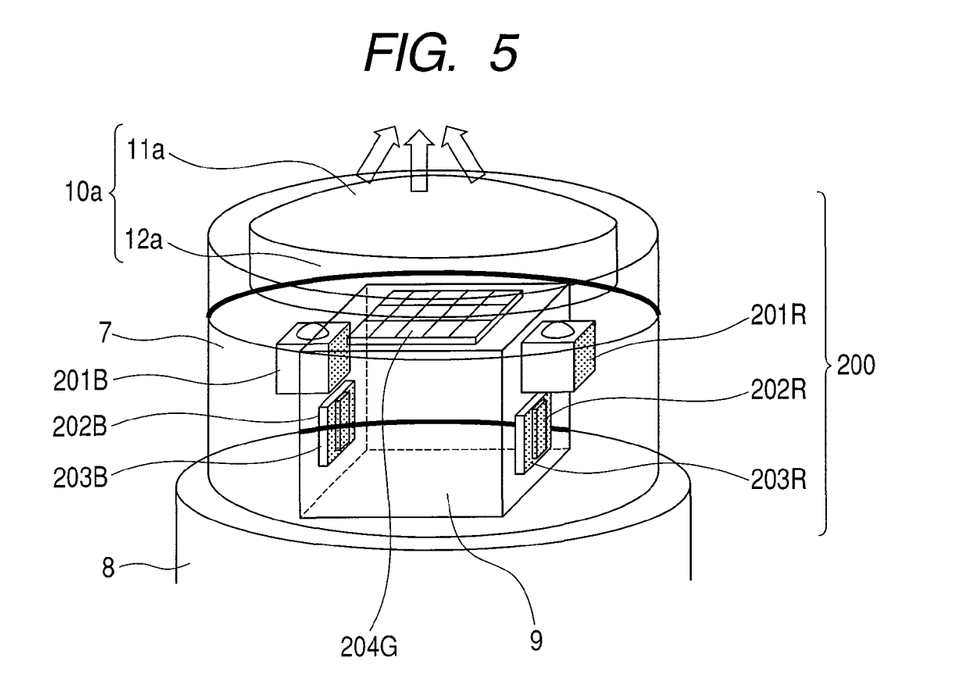
FIG. 5 is a diagram for explaining the outline of a light source section in the multi-wavelength light emitting device according to a fourth preferred embodiment of the present invention.

Referring to FIG. 5, there is shown a diagram for explaining the outline of a light source section in the multi-wavelength light emitting device according to a fourth preferred embodiment of the present invention.

In the multi-wavelength light emitting device according to the fourth preferred embodiment, there is provided a light source section 200 comprising a red light source unit (lens 201R, semiconductor laser diode 202R, submount 203R), a blue light source unit (lens 201B, semiconductor laser diode 202B, submount 203B), and a green light source unit (light emitting diode (LED) array 204G).

A condenser lens section 10*a*, comprising a condenser lens 11*a* and a lens holder 12*a*, is supported by a cover holder 7. The light guide section 1 is arranged similarly to that of the first preferred embodiment.

In the green light source unit 204G according to the fourth preferred embodiment, multiple green light emitting semiconductor elements are integrated in the form of an LED array to produce a high-power level of green light. Further, differently from the case of the first preferred embodiment wherein the three light source units are mounted on the three side faces of the protrusion stage 9 disposed on the stem, the green light source unit 204G is disposed on the top face of the protrusion stage 9 on the stem while the red and blue light source units are disposed on the side faces thereof in the fourth preferred embodiment. Thus, a larger mounting area is provided for the LED array of the green light source unit 204G. The configuration mentioned above enables emission of a high-power level of green light.

As illustrated in FIG. 5, the condenser lens 11*a* concentrates multiple light beams emitted from multiple luminous points included in the light source section 200 for introduction thereof into the light guide section 1. The other arrangements are similar to those of the first preferred embodiment.

Where the multi-wavelength light emitting device according to the fourth preferred embodiment is employed in the image projector according to the third preferred embodiment, it is possible to suppress misreproduction of colors and attenuation of light intensity in on-screen image projection.

Fifth Preferred Embodiment

Figure 6:
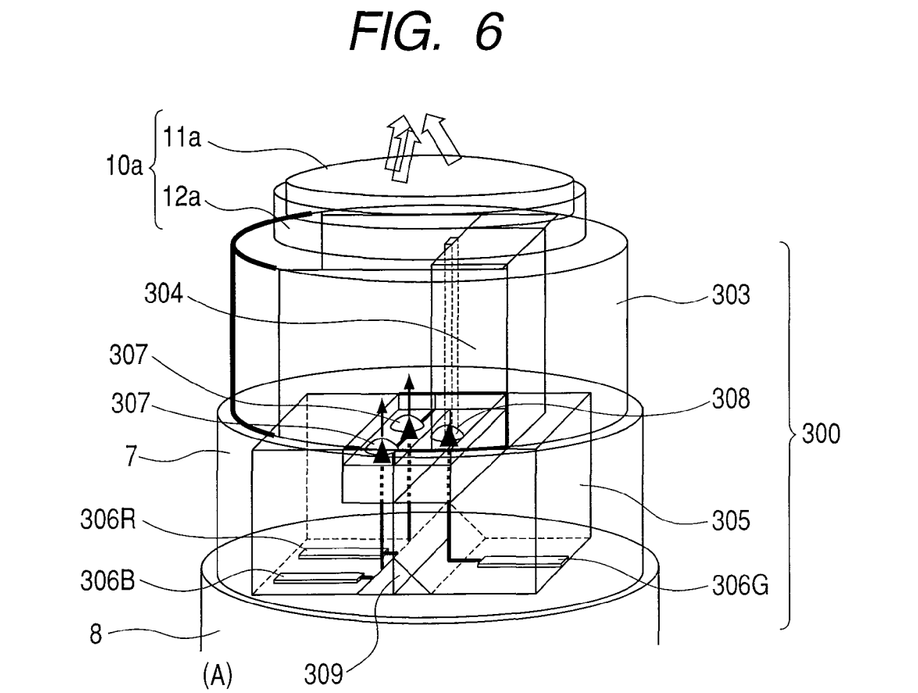
FIG. 6 is a diagram for explaining the outline of a light source section in the multi-wavelength light emitting device according to a fifth preferred embodiment of the present invention.

Referring to FIG. 6, there is shown a diagram for explaining a light source section in the multi-wavelength light emitting device according to a fifth preferred embodiment of the present invention.

In the multi-wavelength light emitting device according to the fifth preferred embodiment, a light source section 300 includes a red-light edge-emitting semiconductor laser 306R, a blue-light edge-emitting semiconductor laser 306B, and a green-light-emission wavelength conversion laser. The green-light-emission wavelength conversion laser includes a wavelength conversion element (nonlinear crystal part 304, holding part 303), a fundamental-wave infrared edge-emitting semiconductor laser 306G (wavelength $\lambda=1060$ nm), and a right-angle (90° angle) mirror 309 for upward bending of light beams emitted from the edge-emitting semiconductor lasers. For infrared light emitted from the fundamental-wave infrared edge-emitting semiconductor laser 306G, it is required to perform wavelength control in phase matching with the nonlinear crystal part 304. For this purpose, a temperature control mechanism is provided additionally. In the above-mentioned wavelength conversion laser where a laser beam having a wavelength of 1060 nm is used as a fundamental wave, a green light beam having a wavelength of 530 nm can be obtained by virtue of the nonlinear effect of second-harmonic generation (SHG).

The red-light edge-emitting semiconductor laser 306R, the blue-light edge-emitting semiconductor laser 306B, and the fundamental-wave infrared edge-emitting semiconductor laser 306G included in the green-light-emission wavelength conversion laser are mounted on a multilayer laminate substrate 305 (to be described in detail later).

Lenses 307 are provided to serve as collimating lenses for collimation of light beams emitted from the red-light edge-emitting semiconductor laser 306R and the blue-light edge-emitting semiconductor laser 306B. In addition, a lens 308 is provided to serve as a condenser lens for introducing a light beam from the infrared edge-emitting semiconductor laser 306G into the nonlinear crystal part 304. These lenses 307 and 308 are mounted on the multilayer laminate substrate 305.

The periphery of the holding part 303 is secured to a cover holder 7, and the holder part 303 is formed in a cylindrical configuration having an arc-segment rectangular-parallelepiped recess with rectangular side faces. The nonlinear crystal part 304 included in the wavelength conversion laser is secured to the rectangular side faces of the holding part 303.

A condenser lens section 10*a*, includes a condenser lens 11*a* and a lens holder 12*a*, is supported by the holding part 303.

As shown in FIG. 6, the condenser lens 11*a* concentrates multiple light beams emitted from multiple luminous points included in the light source section 300 for introduction thereof into the light guide section 1.

The light guide section 1 is arranged similarly to that of the first preferred embodiment.

Figure 7A:
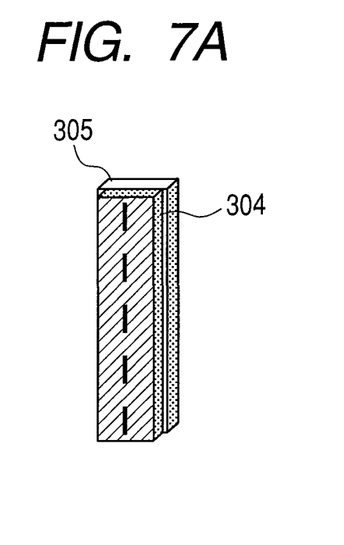
FIG. 7 is a diagram for explaining the outlines of a nonlinear crystal part and a holding part therefor of a wavelength conversion laser in the multi-wavelength light emitting device according to the fifth preferred embodiment of the present invention.
Figure 7B:
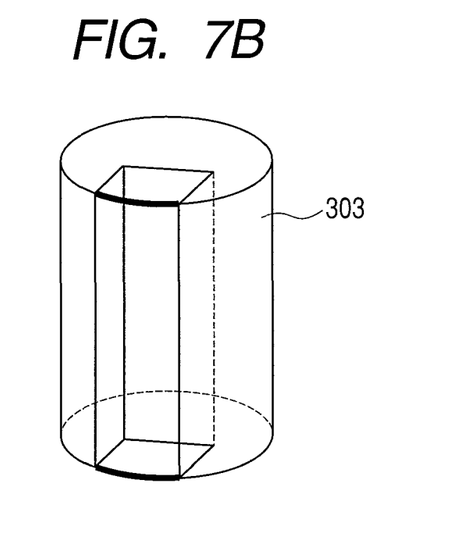
Figure 7C:
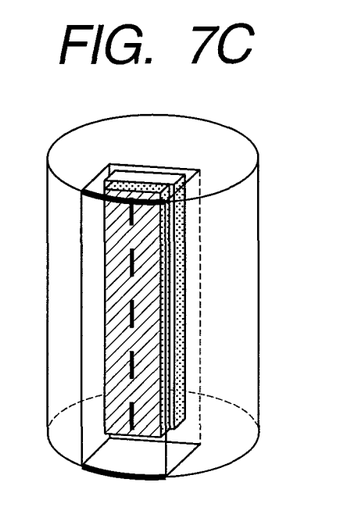

Referring to FIG. 7, there is shown a diagram for explaining the outlines of the nonlinear crystal part 304 and the holding part 303 of the wavelength conversion laser in the multi-wavelength light emitting device according to the fifth preferred embodiment.

For wavelength conversion through use of the nonlinear crystal part 304, it is required to provide phase matching between the nonlinear crystal part 304 and fundamental-wave infrared light. In common practice, tuning for phase matching adjustment in a nonlinear crystal part is performed by temperature control. In the fifth preferred embodiment, two temperature control terminals and two temperature monitor terminals, i.e., a total of four terminals, are provided for temperature control of the nonlinear crystal part 304. Since the multilayer laminate substrate 305 is used as a submount in the fifth preferred embodiment, temperature control wiring lines can be laid in a high-density low-noise arrangement without the need for intricate wiring line routing.

The holding part 303 having the nonlinear crystal part 304 mounted thereon is secured to the cover holder 7 as shown in FIG. 6.

Figure 8:
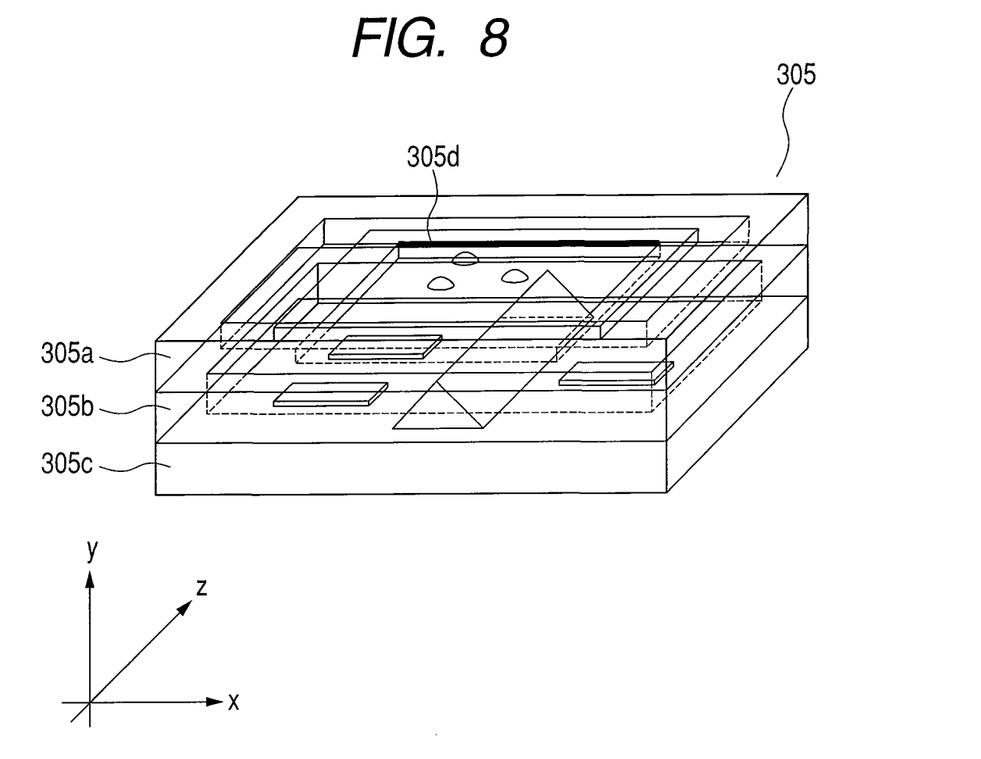
FIG. 8 is a diagrammatic perspective view of the light source section in the multi-wavelength light emitting device according to the fifth preferred embodiment of the present invention.
Figure 9:
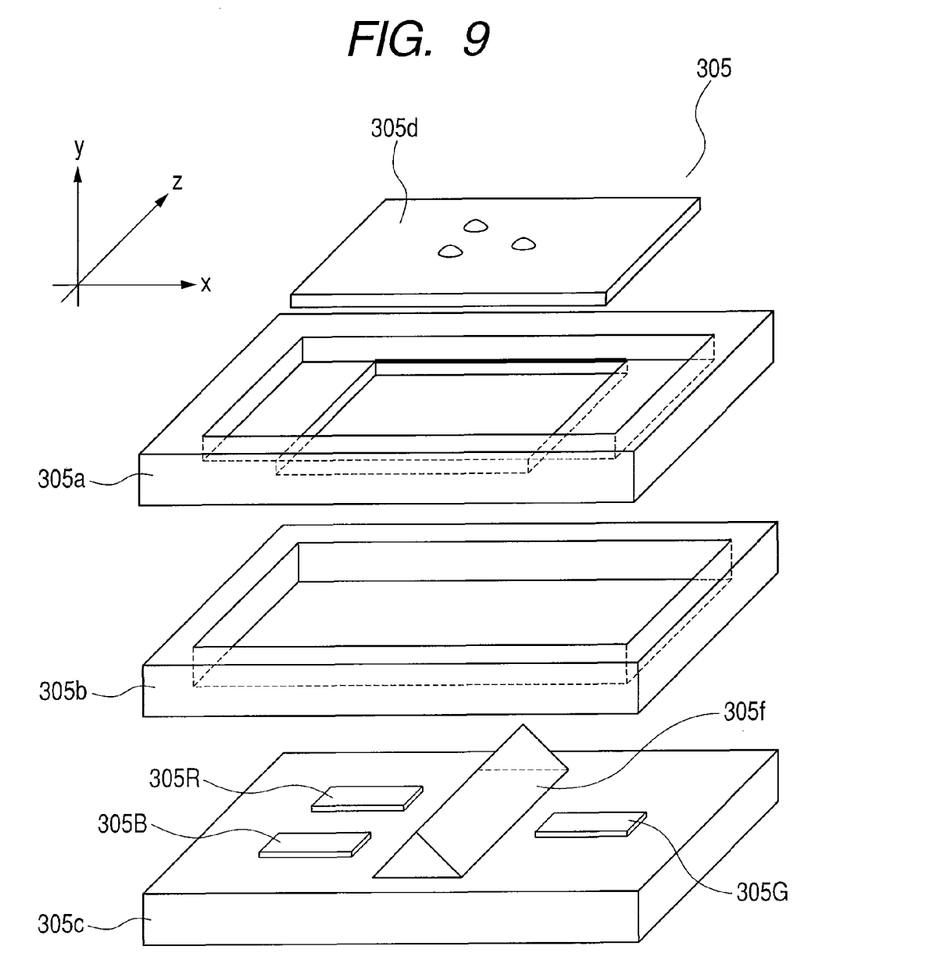
FIG. 9 is an exploded perspective view of a multilayer laminate substrate according to the fifth preferred embodiment of the present invention.

Referring to FIGS. 8 and 9, there are shown explanatory diagrams regarding a mounting arrangement of multiple light sources in the multi-wavelength light emitting device according to the fifth preferred embodiment. FIG. 8 shows a diagrammatic perspective view of the light source section in the multi-wavelength light emitting device, and FIG. 9 shows an exploded perspective view of the multilayer laminate substrate 305.

The multilayer laminate substrate 305 shown in FIG. 8 is a low-temperature co-fired ceramics (LTCC) substrate. The red-light edge-emitting semiconductor laser 306R, blue-light edge-emitting semiconductor laser 306B, infrared edge-emitting semiconductor laser 305G, and right-angle mirror 305f are mounted on a first layer 305c of the multilayer laminate substrate 305. A second layer 305b serving as a spacer is disposed over the first layer 305c, and further a third layer 305a is disposed thereover.

As shown in FIG. 9, using a stepped recess formed on the third layer 305a, a plate lid having the collimating and condenser lenses is secured to the third layer 305a. More specifically, the plate lid is sealingly secured to the upper-stage recess of the third layer 305a. Instead of using the stepped recess formed on the third layer 305a, there may also be provided a modified arrangement wherein the third layer 305a is configured to have a recess larger than a recess of the second layer 305b so that an inner peripheral edge of the recess of the second layer 305b is exposed through the recess of the third layer 305a, and wherein the plate lid is secured to the inner peripheral edge of the recess of the second layer 305b. In this modified arrangement, the second layer 305b should be arranged to provide adequate sealing space for serving as a spacer capable of protecting the semiconductor lasers, i.e., the second layer 305b should have a larger thickness, and the recess thereof should have a depth larger than the heights of optical components such as the semiconductor lasers and the right-angle mirror 305f to be disposed inside the recess.

As shown in FIG. 8, on the multilayer laminate substrate 305, optical devices and components may be mounted after the first layer 305c, second layer 305b, and third layer 305c are assembled.

Sixth Preferred Embodiment

Figure 10:
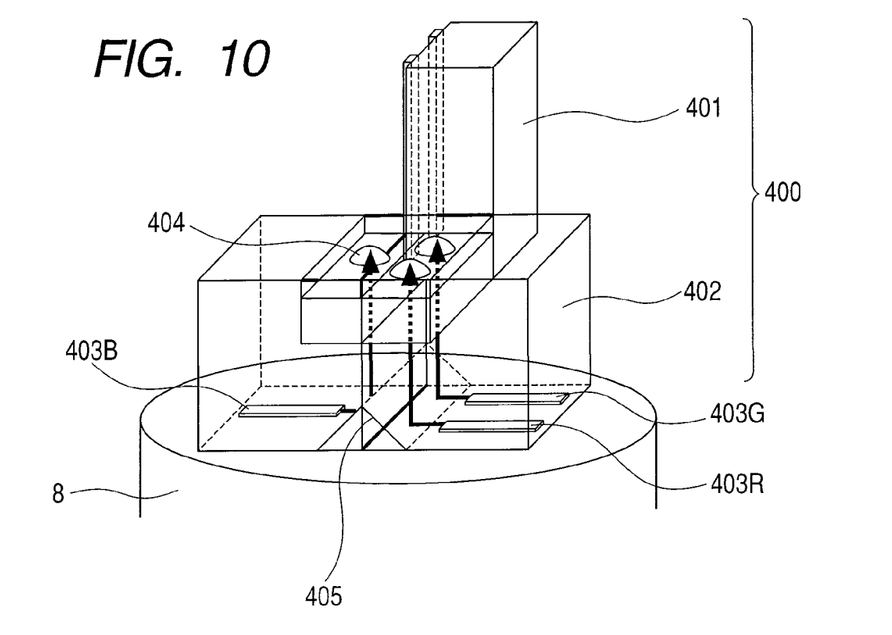
FIG. 10 is a diagram for explaining the outline of a light source section in the multi-wavelength light emitting device according to a sixth preferred embodiment of the present invention.

Referring to FIG. 10, there is shown a diagram for explaining the outline of a light source section in the multi-wavelength light emitting device according to a sixth preferred embodiment of the present invention.

In the multi-wavelength light emitting device according to the sixth preferred embodiment, a light source section 400 includes a blue-light edge-emitting semiconductor laser (403B), a green-light-emission wavelength conversion laser (fundamental-wave infrared edge-emitting semiconductor laser 403G, nonlinear crystal part 401), and a red-light-emission wavelength conversion laser (fundamental-wave infrared edge-emitting semiconductor laser 403R, nonlinear crystal part 401). Light beams emitted from the semiconductor lasers are reflected by a right-angle (90° angle) mirror 405 disposed in a multilayer laminate substrate 402 and then output through lenses 404 disposed thereon.

In display applications, it is generally regarded as preferable that a red light source should have a wavelength of 620 nm from a viewpoint of color visibility. However, at present, a red light source having a wavelength shorter than 638 nm is not obtainable by using a semiconductor laser. Hence, to provide a red light source having a wavelength of 620 nm in the sixth preferred embodiment, the red-light-emission wavelength conversion laser is employed. Where a fundamental-wave infrared semiconductor laser having a wavelength of 1240 nm is used in wavelength conversion for red light emission, red light having a wavelength of 620 nm can be provided.

In the field of wavelength conversion laser technology, significant advances have recently been made to improve the quality of nonlinear crystal material, resulting in the efficiency of conversion exceeding 20%. This level of conversion efficiency of wavelength conversion lasers can be rated as being comparable to that of semiconductor lasers. On account of the characteristics of wavelength conversion lasers, the level of power consumption thereof in a high power output region is commonly recognized to be almost equivalent to that of semiconductor lasers. Hence, there is a growing interest in using wavelength conversion lasers wherein any wavelength is selectable as a light source wavelength as well as a green light source wavelength.

In the arrangement shown in FIG. 10, only one nonlinear crystal part is used to form two wavelength conversion lasers, i.e., a green-light-emission wavelength conversion laser and a red-light-wavelength conversion laser. Thus, a substantial increase in component part count is not incurred in cases where the arrangement including two wavelength conversion lasers and one semiconductor laser is adopted to provide an RGB light source instead of the foregoing arrangement including one wavelength conversion laser and two semiconductor lasers.

In the use of one nonlinear crystal part, temperature control can be carried out collectively. This contributes to a decrease in the number of wiring terminals as compared with the case where multiple nonlinear crystal parts are subjected to temperature control.

As can be seen from FIG. 10, it is allowed to arrange multiple wavelength conversion lasers in an array form to meet the purpose of application, e.g., the sixth preferred embodiment is applicable to a requirement level of high power output exceeding the order of 10 W.

The other arrangements are similar to those of the fifth preferred embodiment.

Seventh Preferred Embodiment

Figure 11:
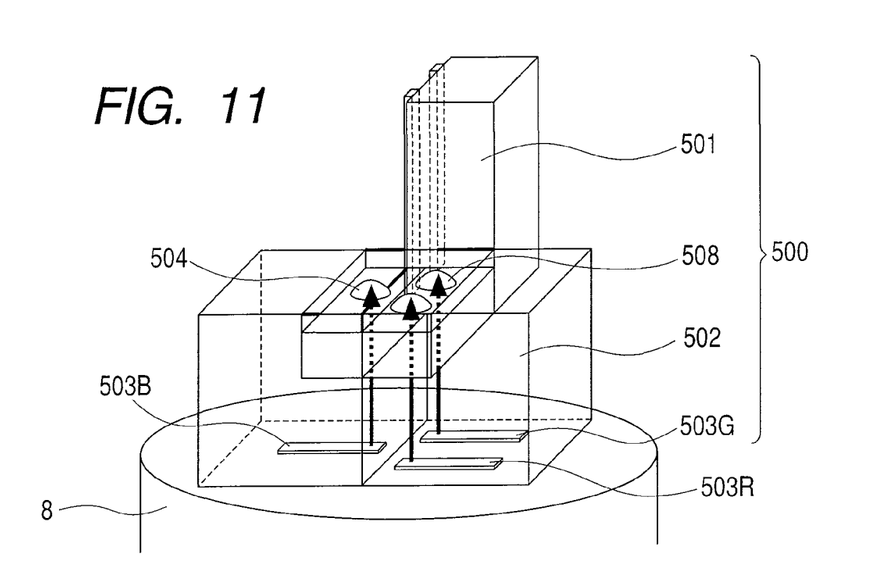
FIG. 11 is a diagram for explaining the outline of a light source section in the multi-wavelength light emitting device according to a seventh preferred embodiment of the present invention.

Referring to FIG. 11, there is shown a diagram for explaining the outline of a light source section in the multi-wavelength light emitting device according to a seventh preferred embodiment of the present invention.

In the multi-wavelength light emitting device according to the seventh preferred embodiment, a light source section 500 includes a blue-light surface-emitting semiconductor laser (503B), a green-light-emission wavelength conversion laser (fundamental-wave infrared surface-emitting semiconductor laser 503G, nonlinear crystal part 501), and a red-light-emission wavelength conversion laser (fundamental-wave infrared surface-emitting semiconductor laser 503R, nonlinear crystal part 501). Light beams emitted from the semiconductor lasers are output through lenses 504 and 508 disposed on a multilayer laminate substrate 502.

The term "surface-emitting semiconductor laser" as used herein indicates VCSEL (Vertical-Cavity Surface-Emitting Laser), HCSEL (Horizontal-Cavity Surface-Emitting Laser), or LISEL (Lens Integrated Surface-Emitting Laser).

As shown in FIG. 11, no right-angle mirror is required in the light source arrangement of the multi-wavelength light emitting device according to the seventh preferred embodiment, thereby leading to a decrease in component part count.

The other arrangements are similar to those of the fifth preferred embodiment.

Eighth Preferred Embodiment

Figure 12:
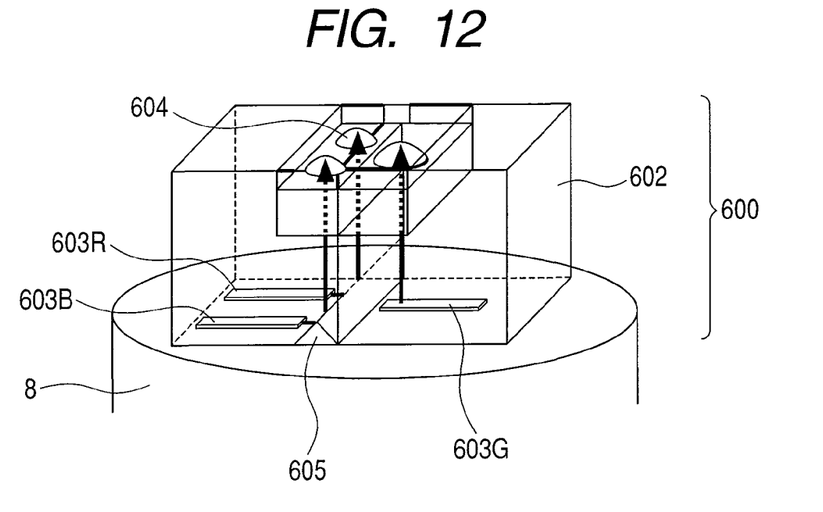
FIG. 12 is a diagram for explaining the outline of a light source section in the multi-wavelength light emitting device according to an eighth preferred embodiment of the present invention.

Referring to FIG. 12, there is shown a diagram for explaining the outline of a light source section in the multiwavelength apparatus according to an eighth preferred embodiment of the present invention.

In the multi-wavelength light emitting device according to the eighth preferred embodiment, a light source section 600 includes a red-light edge-emitting semiconductor laser 603R, a blue-light edge-emitting semiconductor laser 603B, and a green-light surface-emitting element 603G. In a multilayer laminate substrate 602, there are provided a right-angle (90° angle) mirror 602 and lenses 604 through which light beams are output.

Since the red-light and blue-light edge-emitting semiconductor lasers 603R and 603B are provided as shown in FIG. 12, the right-angle mirror 605 is used for upward bending of light beams emitted from these edge-emitting semiconductor lasers. Contrastingly, for the green-light surface-emitting element 603G, it is not required to use a right-angle mirror. As the green light source in the eighth preferred embodiment, there may also be provided such a modified arrangement that green light emitting elements are formed in an array to meet particular application specifications.

The other arrangements are similar to those of the fifth preferred embodiment.

Ninth Preferred Embodiment

Figure 13:
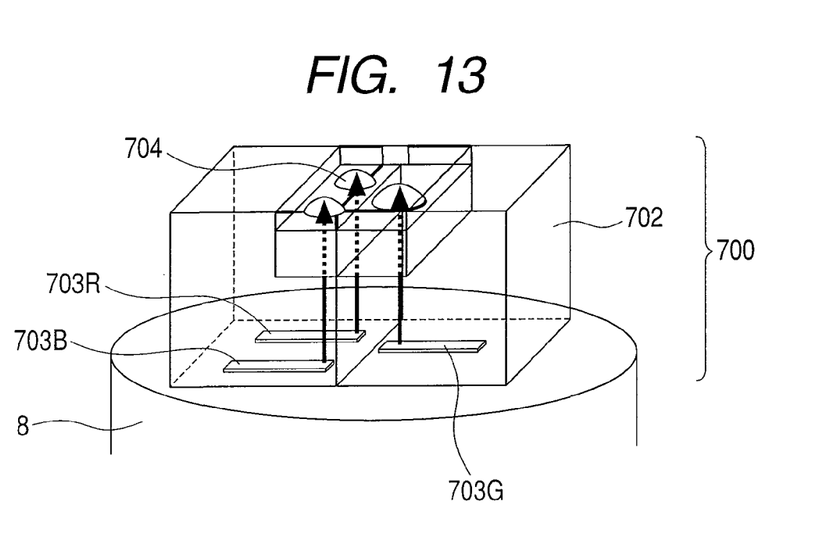
FIG. 13 is a diagram for explaining the outline of a light source section in the multi-wavelength light emitting device according to a ninth preferred embodiment of the present invention.

Referring to FIG. 13, there is shown a diagram for explaining a light source section in the multi-wavelength light emitting device according to a ninth preferred embodiment of the present invention.

In the multi-wavelength light emitting device according to the ninth preferred embodiment, a light source section 700 includes a red light source 703R, a blue light source 703B, and a green light source 703G, all of which are of a surface-emitting element type. Light beams emitted from these light sources are output through lenses 704 disposed on a multilayer laminate substrate 702.

In the ninth preferred embodiment wherein all the light sources are of a surface-emitting element type, there is no need to provide a right-angle mirror that is required for upward bending of light beams in the case where edge-emitting semiconductor lasers are used.

The other arrangements are similar to those of the fifth preferred embodiment.

While the present invention has been described as related to the preferred embodiments wherein the multiwavelength light source is configured as an RGB light source module, it is to be understood that the present invention is not limited thereto. For example, there may also be provided a modified form wherein the multi-wavelength light emitting device includes an arrayed identical-wavelength light source, an arrayed identical-color light source, or a combination thereof.

What is claimed is:

1. A multi-wavelength light emitting device comprising:
a light source section comprising a plurality of luminous points that emit a plurality of light beams, each of which has a different wavelength;
a condenser lens section that concentrates the light beams emitted from the luminous points; and
a light guide section that propagates superposedly and mixedly the light beams concentrated by the condenser lens section after emission thereof from the luminous points; wherein:
at least one of the luminous points comprises an edge-emitting semiconductor laser mounted on a side face of a protrusion such that the light beam emitted from the edge-emitting semiconductor laser is substantially parallel to the side face of the protrusion, and is substantially parallel to an axis of the condenser section.

2. The multi-wavelength light emitting device according to claim 1,
wherein at least either one of input and output end faces of the light guide section is provided with an optical element.

3. The multi-wavelength light emitting device according to claim 1,
wherein the light source section, the condenser lens section, and the light guide section are contained in one modular package, which is mounted on a can-stem.

4. The multi-wavelength light emitting device according to claim 1,
wherein the light guide section comprises a component selected from the group consisting of an optical fiber cable, a bundle optical fiber cable, a liquid crystalline fiber cable, a light guide plate, a light tunnel, and a light pipe.

5. The multi-wavelength light emitting device according to claim 1,
wherein at least one of the luminous points comprises a component selected from the group consisting of a semiconductor laser and a semiconductor light emitting element.

6. The multi-wavelength light emitting device according to claim 1,
wherein at least one of the luminous points comprises a component selected from the group consisting of a wavelength conversion laser formed with a fundamental-wave semiconductor laser and a nonlinear crystal part serving as a wavelength conversion element, a semiconductor laser, and a semiconductor light emitting element.

7. The multi-wavelength light emitting device according to claim 1,
wherein at least one of the luminous points comprises a component selected from the group consisting of a wavelength conversion laser formed with a fundamental-wave semiconductor laser and a nonlinear crystal part serving as a wavelength conversion element, a semiconductor laser, and a semiconductor light emitting element, each of which is disposed in a recess of a multilayer laminate substrate.

8. The multi-wavelength light emitting device according to claim 1,
wherein at least one of the luminous points comprises a wavelength conversion laser formed with a fundamental-wave semiconductor laser and a nonlinear crystal part serving as a wavelength conversion element, and the nonlinear crystal part included in the wavelength conversion laser is mounted by using a multilayer laminate substrate.

9. A multi-wavelength light emitting device comprising:

a light source section comprising a plurality of luminous points that emit a plurality of light beams, each of which has a different wavelength;

a condenser lens section that concentrates the light beams emitted from the luminous points; and a light guide section that propagates superposedly and mixedly the light beams concentrated by the condenser lens section after emission thereof from the luminous points; wherein:

at least one of the luminous points comprises an edge-emitting semiconductor laser, and the light beam emitted from the edge-emitting semiconductor laser is bent by a right-angle mirror before reaching the condenser lens section.

* * * * *